United States Patent
Dip et al.

(10) Patent No.: US 7,737,051 B2
(45) Date of Patent: Jun. 15, 2010

(54) SILICON GERMANIUM SURFACE LAYER FOR HIGH-K DIELECTRIC INTEGRATION

(75) Inventors: Anthony Dip, Cedar Creek, TX (US); Pradip K. Roy, Orlando, FL (US); Sanjeev Kaushal, Austin, TX (US); Allen J. Leith, Austin, TX (US); Seungho Oh, Austin, TX (US); Raymond Joe, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 904 days.

(21) Appl. No.: 10/797,876

(22) Filed: Mar. 10, 2004

(65) Prior Publication Data
US 2005/0199877 A1  Sep. 15, 2005

(51) Int. Cl.
*H01L 21/36* (2006.01)
(52) U.S. Cl. .................... 438/785; 257/E21.092
(58) Field of Classification Search ............ 438/285, 438/287, 785; 257/E21.091, E21.092
See application file for complete search history.

(56) References Cited

U.S. PATENT DOCUMENTS

| 5,259,881 A | 11/1993 | Edwards et al. ......... 118/719 |
| 6,296,711 B1 | 10/2001 | Loan et al. ........... 118/726 |
| 6,488,777 B2 | 12/2002 | Madan et al. .......... 118/718 |
| 6,632,729 B1 * | 10/2003 | Paton ................. 438/535 |
| 6,909,151 B2 * | 6/2005 | Hareland et al. ......... 257/369 |
| 2003/0209816 A1 * | 11/2003 | Yamaguchi et al. ....... 257/900 |
| 2003/0218189 A1 * | 11/2003 | Christiansen et al. ..... 257/200 |

FOREIGN PATENT DOCUMENTS

EP  0684650 B1  8/2001

OTHER PUBLICATIONS

Stephen St. Onge and Mark Dupuis, *Innovations in Silicon Germanium Bicmos Processing*, Semiconductor Fabtech—12th Edition, pp. 195-199, published Jul. 2000.
Cho et al., *Interfacial Characteristics of $HfO_2$ Films Grown on Strained $Si_{0.7}Ge_{0.3}$ by Atomic-Layer Deposition*, Applied Physics Letters, vol. 84, No. 7, Feb. 16, 2004, pp. 1171-1173.
J. Westlinder et al., *Effects of Low-Temperature Water Vapor Annealing of Strained SiGe Surface-Channel pMOSFETs with High-k Dielectric*, European Solid-State Device Research, Sep. 16, 2003, pp. 525-528.

(Continued)

*Primary Examiner*—Lynne A Gurley
*Assistant Examiner*—Colleen A Matthews
(74) *Attorney, Agent, or Firm*—Wood, Herron & Evans, LLP

(57) ABSTRACT

A method for using a silicon germanium (SiGe) surface layer to integrate a high-k dielectric layer into a semiconductor device. The method forms a SiGe surface layer on a substrate and deposits a high-k dielectric layer on the SiGe surface layer. An oxide layer, located between the high-k dielectric layer and an unreacted portion of the SiGe surface layer, is formed during one or both of deposition of the high-k dielectric layer and an annealing process after deposition of the high-k dielectric layer. The method further includes forming an electrode layer on the high-k dielectric layer.

21 Claims, 4 Drawing Sheets

OTHER PUBLICATIONS

S. Pal et al., *$Gd_2O_3$, $Ga_2O_3(Gd_2O_3)$, $Y_2O_3$, and $Ga_2O_3$, as High-k Gate Dielectrics on SiGe: A Comparative Study*, J. Applied Physics, vol. 90, No. 8, Oct. 15, 2001, pp. 4103-4107.

Choi et al., *Electrical Characteristics of $ZrO_2$ Gate Dielectric Deposited on Ultrathin Silicon Capping Layer for SiGe Metal-Oxide-Semiconductor Device Applications*, Jpn. J. Appl. Physics, Part 1, vol. 41, No. 8, Aug. 2002, pp. 5129-5130.

Chatterjee et al., *Electrical Properties of Stacked Gate Dielectric ($SiO_2/ZrO_2$) Deposited on Strained SiGe Layers*, Thin Solid Films, vol. 422, No. 1-2, Dec. 20, 2002, pp. 33-38.

European Patent Office, *International Search Report*, PCT/US2005/000661, Dated Jul. 27, 2005, 5 pp.

\* cited by examiner

SILICON GERMANIUM SURFACE LAYER FOR HIGH-K DIELECTRIC INTEGRATION

FIELD OF THE INVENTION

The present invention relates to semiconductor structures and semiconductor processing, and more particularly, to the use of a silicon germanium layer for integrating a high-k dielectric layer into a semiconductor device.

BACKGROUND OF THE INVENTION

In the semiconductor industry, the minimum feature sizes of microelectronic devices are approaching the deep submicron regime to meet the demand for faster, lower power microprocessors and digital circuits. The downscaling of CMOS devices imposes scaling constraints on the gate dielectric material. The thickness of the standard $SiO_2$ gate dielectric oxide is approaching a level (~10 angstroms (Å)) at which tunneling currents may significantly impact transistor performance. To increase device reliability and reduce electron leakage from the gate electrode to the transistor channel, semiconductor transistor technology is using high-k gate dielectric materials that allow increased physical thickness of the gate dielectric layer while maintaining an equivalent gate oxide thickness (EOT) of less than about 10 Å. The variable "k" refers to the dielectric constant of a material.

Integration of high-k materials into semiconductor microstructures can result in formation of an interfacial oxide ($SiO_2$) layer due to oxidation of the Si substrate. The presence of an oxide interfacial layer lowers the overall dielectric constant of the microstructure, thereby reducing the advantage of using a high-k dielectric material instead of $SiO_2$. To reduce the effect of an oxide interfacial layer on the overall dielectric constant of the microstructure, the oxide layer may need to be thin. Deposition of a high-k dielectric layer onto a Si substrate can result in uncontrolled growth of an oxide interfacial layer that is too thick for current semiconductor transistor technology.

SUMMARY OF THE INVENTION

The present invention provides a semiconductor device having a SiGe surface layer that reduces or solves the above described and/or other problems with prior art semiconductor devices.

The present invention further provides a semiconductor device having a SiGe surface layer that reduces oxidation of the substrate.

To this end, a method is provided for forming a semiconductor device with a SiGe surface layer to reduce oxidation of the substrate associated with subsequent integration of a high-k dielectric layer in the device. An oxide layer is formed between an unreacted portion of the SiGe surface layer and the high-k dielectric layer. The oxide layer may form during deposition of the high-k dielectric layer or during an annealing process carried out after the dielectric layer is formed. Alternatively, the oxide layer may form during both the dielectric formation and subsequent annealing.

In an exemplary embodiment of the invention, a method is provided for forming a semiconductor device by providing a substrate, forming a SiGe surface layer on the substrate, depositing a high-k dielectric layer on the SiGe surface layer, forming an oxide layer between the high-k dielectric layer and an unreacted portion of the SiGe surface layer, the oxide layer being formed during one or both of deposition of the high-k dielectric layer and an annealing process after deposition of the high-k dielectric layer, and forming an electrode layer on the high-k dielectric layer.

DETAILED DESCRIPTION OF EMBODIMENTS OF THE INVENTION

A method for making a semiconductor device is described. In an embodiment of the invention, a substrate is provided and a SiGe surface layer is formed on the substrate. A high-k dielectric layer is deposited on the SiGe surface layer, and an oxide layer, located between the high-k dielectric layer and an unreacted portion of the SiGe surface layer, is formed during the deposition of the high-k dielectric layer and/or in an annealing process after deposition of the high-k dielectric layer, and then an electrode layer is formed on the high-k dielectric layer.

FIGS. 1A-1E represent cross-sections of structures that may be formed when carrying out an embodiment of the present invention. In the embodiment illustrated in FIGS. 1A-1E, a substrate 150 is provided. The substrate 150 can, for example, be a Si substrate that is single-crystal Si or poly-crystalline-Si (poly-Si). The Si substrate 150 can include numerous active devices and/or isolation regions. The Si substrate 150 can be n- or p-type, depending on the type of device being formed, and can, for example, include any diameter substrate, such as a substrate with a diameter greater than about 195 mm, e.g., a 200 mm substrate, a 300 mm substrate, or an even larger substrate.

Figure 1A:
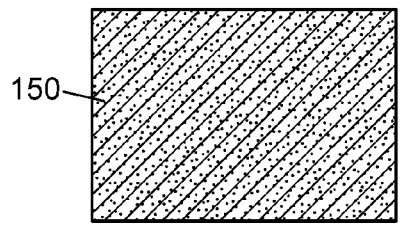
FIGS. 1A-1E represent cross-sections of structures that may be formed when carrying out an embodiment of the present invention.
Figure 1B:
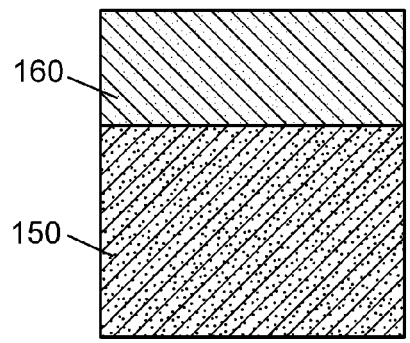

As mentioned in the Background of the Invention section above, integration of high-k dielectric materials onto Si substrates can cause uncontrolled growth of a $SiO_2$ interfacial layer that renders the interfacial layer too thick to be compatible with the desired performance of the semiconductor device. In the present invention, a SiGe surface layer 160 is formed by depositing a SiGe material onto the substrate 150, as shown in FIG. 1B, or by alloying Ge with a surface portion of a Si substrate. The SiGe surface layer allows for direct deposition of a high-k dielectric layer onto the SiGe surface layer without using a base oxide layer at the substrate—SiGe interface, and provides a dielectric layer with an overall low equivalent gate oxide thickness (EOT). Oxidation of the SiGe surface layer 160 prevents oxidation of the Si substrate 150 during deposition of the high-k dielectric layer 180 onto the SiGe surface layer 160 and/or during an annealing process after deposition of the high-k dielectric layer 180 onto the SiGe surface layer 160.

In one embodiment of the invention, the SiGe surface layer 160 can have a substantially uniform composition with a Ge content of about 10 atomic percent (at. %), or less. In another embodiment of the invention, the SiGe surface layer 160 can contain a plurality of SiGe sublayers each with Ge content of about 10 at. %, or less. In yet another embodiment of the invention, the SiGe surface layer 160 can have a graded composition, for example where the Ge content varies from low (~0 at. %) near the interface with the Si substrate 150, to high (~20 at. %) near the interface with the high-k dielectric layer 170. For many applications, the SiGe surface layer may be less than about 1000 angstroms thick, preferably between about 10 angstroms and about 300 angstroms.

Figure 1C:
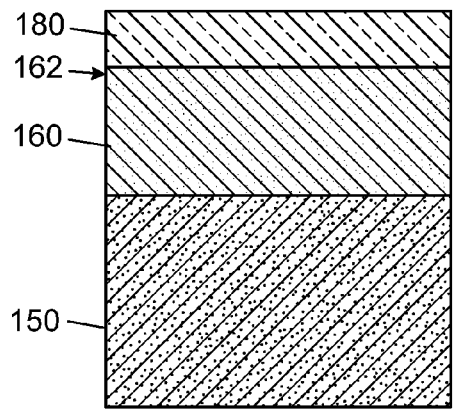
Figure 1D:
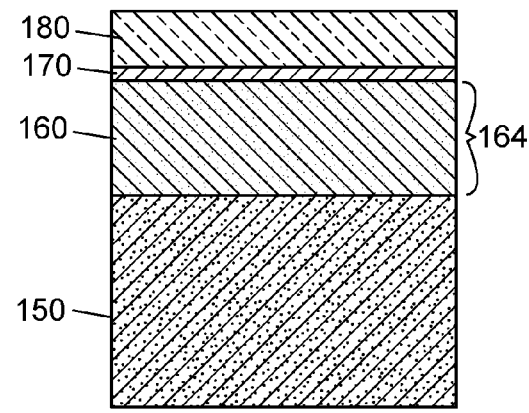
Figure 1E:
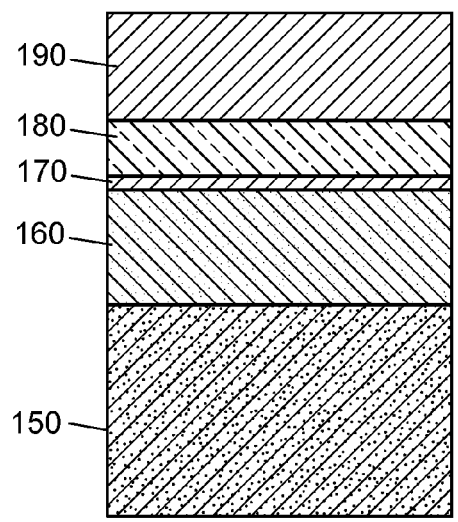

As depicted in FIG. 1C, a high-k dielectric layer 180 is formed on SiGe surface layer 160. High-k dielectric layer 180 contains a material featuring a dielectric constant (k) greater than that of $SiO_2$ (k~3.9). In addition, high-k dielectric materials may refer to high dielectric constant materials (e.g., $HfO_2$, $ZrO_2$) that are deposited onto substrates rather than grown on the surface of the substrate (e.g., $SiO_2$, $SiO_xN_y$). High-k materials may incorporate metal silicates or metal oxides such as $HfO_2$ (k~25), $HfSiO_x$, $ZrO_2$ (k~25), $ZrSiO_x$, $TiO_2$, $Ta_2O_5$ (k~26), and $Al_2O_3$ (k~9). In addition, high-k materials may also include nitrides such as silicon nitride (SiN).

After the high-k dielectric layer 180 is deposited, the structure shown in FIG. 1C is annealed to obtain the required structural and electrical properties. The annealing process forms an oxide layer 170 from oxidation of the surface portion 162 of the SiGe surface layer 160 that is in contact with the high-k dielectric layer 180. As a result, the oxide layer 170 is formed between the high-k dielectric layer 180 and the unreacted portion 164 or base portion of the SiGe surface layer 160. Alternatively, the oxide layer 170 can be formed during deposition of the high-k dielectric layer onto the SiGe surface layer or during both the deposition process and the annealing process. The presence of a SiGe surface layer 160 between the substrate 150 and the high-k dielectric layer 180 can prevent oxidation of the substrate 150.

Next, a gate electrode layer 190 can be formed on the high-k dielectric layer 180. In addition to the traditional doped poly-Si, the electrode layer 190 can, for example, comprise at least one of W, Al, TaN, TaSiN, HfN, HfSiN, TiN, TiSiN, Re, Ru, and SiGe. Deposition of the electrode layer, deposition of the high-k dielectric layer, and annealing of the substrate, as well as etch processes generally required to complete the semiconductor device (e.g., etching of the high-k dielectric layer and the electrode layer), may be carried out by methods well known to those skilled in the art.

Figure 2:
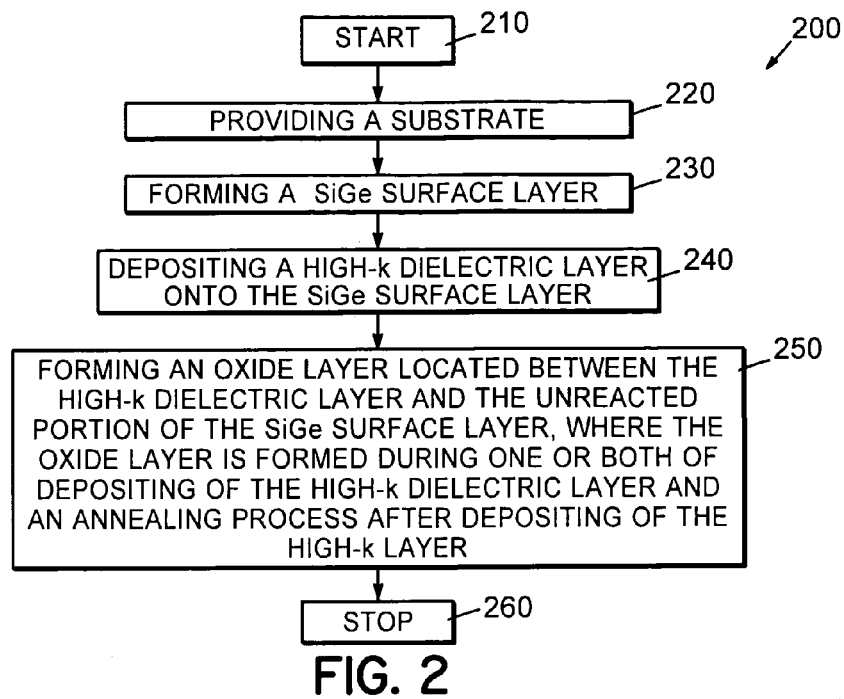
FIG. 2 shows a flow diagram for forming a microstructure containing a SiGe surface layer according to an embodiment of the invention.

FIG. 2 shows a flow diagram for forming a semiconductor device containing a SiGe surface layer according to an embodiment of the invention. The process 200 starts at 210. At 220, a substrate is provided. In one embodiment of the invention, the Si substrate can contain a clean Si substrate where an oxide layer (native or chemical oxide layer) has been removed. An oxide layer can, for example, be removed from the substrate by placing it in a liquid bath containing dilute hydrofluoric acid (HF) or, alternatively, exposing it to HF gas phase etching. The dilute HF liquid solution can be a $H_2O$:HF (e.g., 50:1) mixture. In another embodiment of the invention, the substrate may contain an initial oxide layer. At 230, a SiGe surface layer is formed by depositing a SiGe layer onto the substrate or by alloying a surface portion of a Si substrate with Ge. The SiGe surface layer can contain oxygen if the SiGe surface layer is formed on a substrate containing an initial oxide layer.

In one embodiment of the invention, a SiGe surface layer can be formed using a Ge-containing gas and a Si-containing gas in a CVD process. The Ge-containing gas can, for example, contain at least one of $GeH_4$ and $GeCl_4$, and the Si-containing gas can, for example, contain at least one of $SiH_4$, $Si_2H_6$, and $SiH_2Cl_2$. The SiGe surface layer can, for example, be deposited at a chamber pressure of less than 5 Torr and a substrate temperature between about 400° C. and about 700° C. Deposition parameters that can be utilized to achieve the desired SiGe composition and thickness include chamber pressure, relative flows of the Ge-containing gas and the Si-containing gas, and substrate temperature. In an atomic layer deposition (ALD) process, the substrate is alternately exposed to a Ge-containing gas and a Si-containing gas, until a SiGe surface layer with a desired thickness is formed.

In another embodiment of the invention, SiGe can be sputtered from a SiGe sputtering target onto the substrate. Subsequently, the substrate containing the sputtered SiGe layer can be annealed to form a SiGe surface layer with desired properties. In still another embodiment of the invention, a SiGe surface layer can be formed by sputtering Ge from a Ge sputtering target onto a Si substrate, and annealing the substrate to diffuse the sputtered Ge layer into a surface portion of the Si substrate. In yet another embodiment of the invention, a SiGe surface layer can be formed by exposing a Si substrate to a Ge-containing gas, and annealing the structure during and/or after the exposing.

At 240, following formation of a SiGe surface layer, a high-k dielectric layer is deposited onto the SiGe surface layer. The high-k dielectric layer may be formed using a variety of well known deposition methods, such as thermal chemical vapor deposition (TCVD), plasma-enhanced chemical vapor deposition (PECVD), atomic layer chemical vapor deposition (ALCVD), plasma-enhanced atomic layer deposition (PEALD), or physical vapor deposition (PVD), also known as sputtering. For many semiconductor devices, the high-k dielectric layer 180 may be less than about 100 angstroms thick, and more preferably between about 5 angstroms and about 50 angstroms thick.

When depositing high-k materials such as metal silicates or metal oxides using CVD, a process gas comprising a metal-containing precursor can be introduced into a process chamber containing a heated substrate. The substrate is exposed to the process gas for a time period that results in the desired deposition of the high-k dielectric layer. The process gas can further include a carrier gas (e.g., an inert gas) and/or an oxidizing gas. The inert gas can include at least one of Ar, He, Ne, Kr, Xe, and $N_2$. The addition of inert gas can, for example, dilute the process gas or adjust the process gas partial pressure(s). The oxidizing gas can, for example, contain an oxygen-containing gas comprising at least one of $O_2$, $O_3$, $H_2O$, $H_2O_2$, NO, $NO_2$, and $N_2O$. The role of the oxygen-containing gas in the deposition process can be to fill any oxygen vacancies in the high-k dielectric layer, or to chemically modify the metal-containing precursor. The modification can involve interaction of the oxygen-containing gas with the metal oxide precursor in the gas phase or on the deposition surface.

During processing of the substrate, an oxide layer is formed between the high-k dielectric layer and an unreacted portion of the SiGe surface layer. The oxide layer can be formed during deposition of the high-k dielectric layer at 240, or during an annealing process at 250, or during both. The annealing process can be carried out using a process gas containing an inert gas, or alternatively, the process gas can further contain an oxygen-containing gas including at least one of $O_2$, $O_3$, $H_2O$, $H_2O_2$, NO, $NO_2$, $N_2O$. The oxide layer can be formed during the deposition at 240 by oxygen diffusion from the high-k dielectric layer to the underlying SiGe surface layer, such as where the dielectric layer is a metal oxide, or from oxidation of the SiGe surface layer by exposure to an oxygen-containing gas under oxidizing conditions. Analogously, the oxide layer may be formed during the annealing process at 250 by oxygen diffusion from the high-k dielectric layer to the SiGe surface layer or from oxidation of the SiGe surface layer by exposure to an oxygen-containing gas under oxidizing conditions. Oxidation of the SiGe surface layer can predominantly form $SiO_2$ rather than $GeO_2$, due to the large difference in the heats of formation of $SiO_2$ and $GeO_2$. As a consequence, the oxide layer can preferentially contain $SiO_2$ and Ge diffusion away from the oxide can form a Ge-rich region at the oxide—SiGe surface layer interface. The annealing process at 250 can furthermore homogenize the Ge distribution in the SiGe surface layer and form a $SiO_2$/SiGe interface with good structural and electrical properties.

Figure 3:
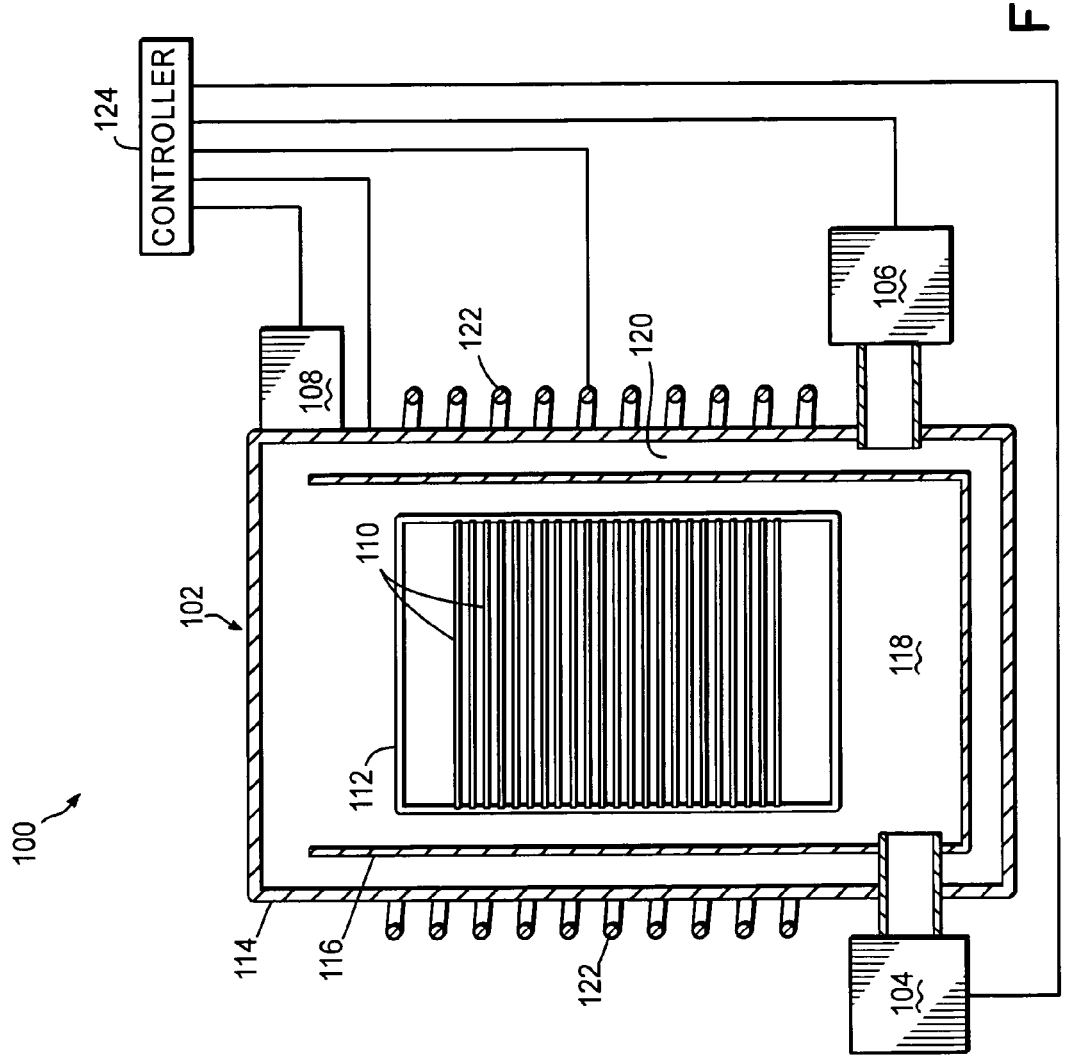
FIG. 3 shows a simplified block diagram of a batch-type processing system for forming a SiGe surface layer according to an embodiment of the invention.

FIG. 3 shows a simplified block diagram of a batch-type processing system for forming a SiGe surface layer on a substrate according to an embodiment of the invention. The batch-type processing system 100 includes a process chamber 102, a gas injection system 104, a heater 122, a vacuum pumping system 106, a process monitoring system 108, and a controller 124. Multiple substrates 110 can be loaded into the process chamber 102 and processed using substrate holder 112. Furthermore, the process chamber 102 comprises an outer section 114 and an inner section 116. In one embodiment of the invention, the inner section 116 can be a process tube.

The gas injection system 104 can introduce gases into the process chamber 102 for purging the process chamber 102, and for preparing, cleaning, and processing the substrates 110. The gas injection system 104 can, for example, include a liquid delivery system (LDS) (not shown) that contains a vaporizer to vaporize a silicon-containing liquid, e.g., hexachlorodisilane ($Si_2Cl_6$). The vaporized liquid can be flowed into the process chamber 102 with the aid of a carrier gas. Alternately, the gas injection system can include a bubbling system where a carrier gas is bubbled through a reservoir containing the silicon-containing liquid. In addition, the gas injection system 104 can be configured for flowing a gaseous silicon-containing gas, e.g., silane ($SiH_4$), from a high-pressure container. Furthermore, the above-mentioned gas flows can, for example, contain an inert gas. A plurality of gas supply lines can be arranged to flow gases into the process chamber 102. The gases can be introduced into volume 118, defined by the inner section 116, and exposed to substrates 110. Thereafter, the gases can flow into the volume 120, defined by the inner section 116 and the outer section 114, and exhausted from the process chamber 102 by the vacuum pumping system 106.

Substrates 110 can be loaded into the process chamber 102 and processed using substrate holder 112. The batch-type processing system 100 can allow for a large number of tightly stacked substrates 110 to be processed, thereby resulting in high substrate throughput. A substrate batch size can, for example, be about 100 substrates (wafers), or less. Alternately, the batch size can be about 25 substrates, or less. The process chamber 102 can, for example, process a substrate of any size, for example 200 mm substrates, 300 mm substrates, or even larger substrates. The substrates 110 can, for example, comprise semiconductor substrates (e.g. silicon or compound semiconductor), LCD substrates, and glass substrates.

The batch-type processing system 100 can be controlled by a controller 124 capable of generating control voltages sufficient to communicate and activate inputs of the batch-type processing system 100 as well as monitor outputs from the batch-type processing system 100. Moreover, the controller 124 can be coupled to and exchange information with process chamber 102, gas injection system 104, heater 122, process monitoring system 108, and vacuum pumping system 106. For example, a program stored in the memory of the controller 124 can be utilized to control the aforementioned components of the batch-type processing system 100 according to a stored process recipe. One example of controller 124 is a DELL PRECISION WORKSTATION 610™, available from Dell Corporation, Dallas, Tex.

Real-time process monitoring can be carried out using process monitoring system 108. In general, the process monitoring system 108 is a versatile monitoring system and can, for example, comprise a mass spectrometer (MS) or a Fourier Transform Infra-red (FTIR) spectrometer. The process monitoring system 108 can provide qualitative and quantitative analysis of the gaseous chemical species in the process environment. Process parameters that can be monitored include gas flows, gas pressure, ratios of gaseous species, and gas purities. These parameters can be correlated with prior process results and various physical properties of the deposited silicon-containing film.

Figure 4:
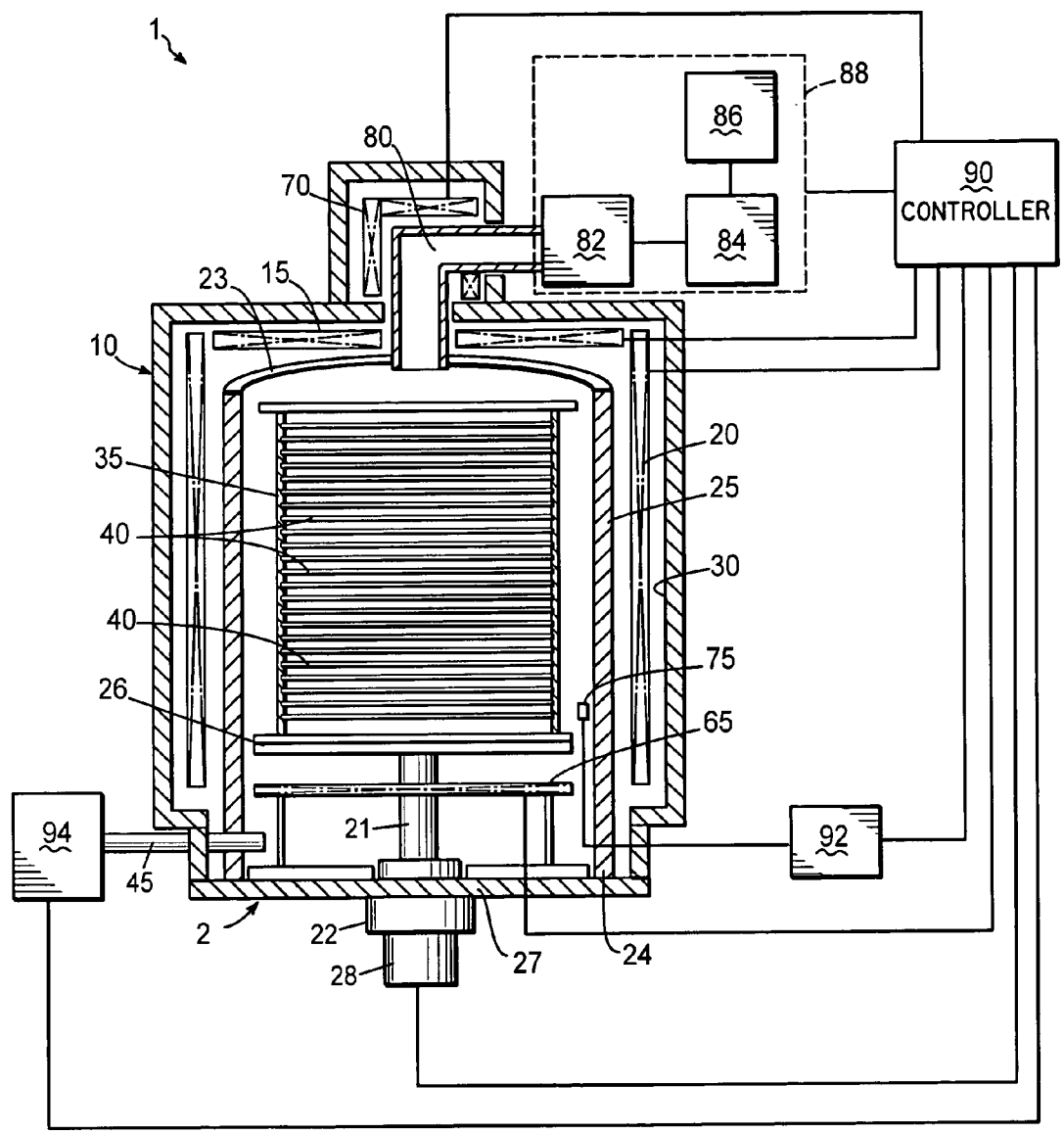
FIG. 4 shows a simplified block diagram of another batch-type processing system for forming a SiGe surface layer according to an embodiment of the invention.

FIG. 4 shows a simplified block diagram of another batch-type processing system for forming a SiGe surface layer on a substrate according to an embodiment of the invention. The batch-type processing system 1 contains a process chamber 10 and a process tube 25 that has a upper end connected to a exhaust pipe 80, and a lower end hermetically joined to a lid 27 of cylindrical manifold 2. The exhaust pipe 80 discharges gases from the process tube 25 to a vacuum pumping system 88 to maintain a pre-determined atmospheric or below atmospheric pressure in the processing system 1. A substrate holder 35 for holding a plurality of substrates (wafers) 40 in a tier-like manner (in respective horizontal planes at vertical intervals) is placed in the process tube 25. The substrate holder 35 resides on a turntable 26 that is mounted on a rotating shaft 21 penetrating the lid 27 and driven by a motor 28. The turntable 26 can be rotated during processing to improve overall film uniformity or, alternately, the turntable can be stationary during processing. The lid 27 is mounted on an elevator 22 for transferring the substrate holder 35 in and out of the reaction tube 25. When the lid 27 is positioned at its uppermost position, the lid 27 is adapted to close the open end of the manifold 2.

A plurality of gas supply lines can be arranged around the manifold 2 to supply a plurality of gases into the process tube 25 through the gas supply lines. In FIG. 4, only one gas supply line 45 among the plurality of gas supply lines is shown. The gas supply line 45 is connected to a gas injection system 94. A cylindrical heat reflector 30 is disposed so as to cover the reaction tube 25. The heat reflector 30 has a mirror-finished inner surface to suppress dissipation of radiation heat radiated by main heater 20, bottom heater 65, top heater 15, and exhaust pipe heater 70. A helical cooling water passage (not shown) is formed in the wall of the process chamber 10 as a cooling medium passage.

A vacuum pumping system 88 comprises a vacuum pump 86, a trap 84, and automatic pressure controller (APC) 82. The vacuum pump 86 can, for example, include a dry vacuum pump capable of a pumping speed up to 20,000 liters per second (and greater). During processing, gases can be introduced into the process chamber 10 via the gas injection system 94 and the process pressure can be adjusted by the APC 82. The trap 84 can collect unreacted precursor material and by-products from the process chamber 10.

The process monitoring system 92 comprises a sensor 75 capable of real-time process monitoring and can, for example, comprise a MS or a FTIR spectrometer. A controller 90 includes a microprocessor, a memory, and a digital I/O port capable of generating control voltages sufficient to communicate and activate inputs to the processing system 1 as well as monitor outputs from the processing system 1. Moreover, the controller 90 is coupled to and can exchange information with gas injection system 94, motor 28, process monitoring system 92, heaters 20, 15, 65, and 70, and vacuum pumping system 88. As with the controller 124 of FIG. 3, the controller 90 may be implemented as a DELL PRECISION WORKSTATION 610™.

Figure 5:
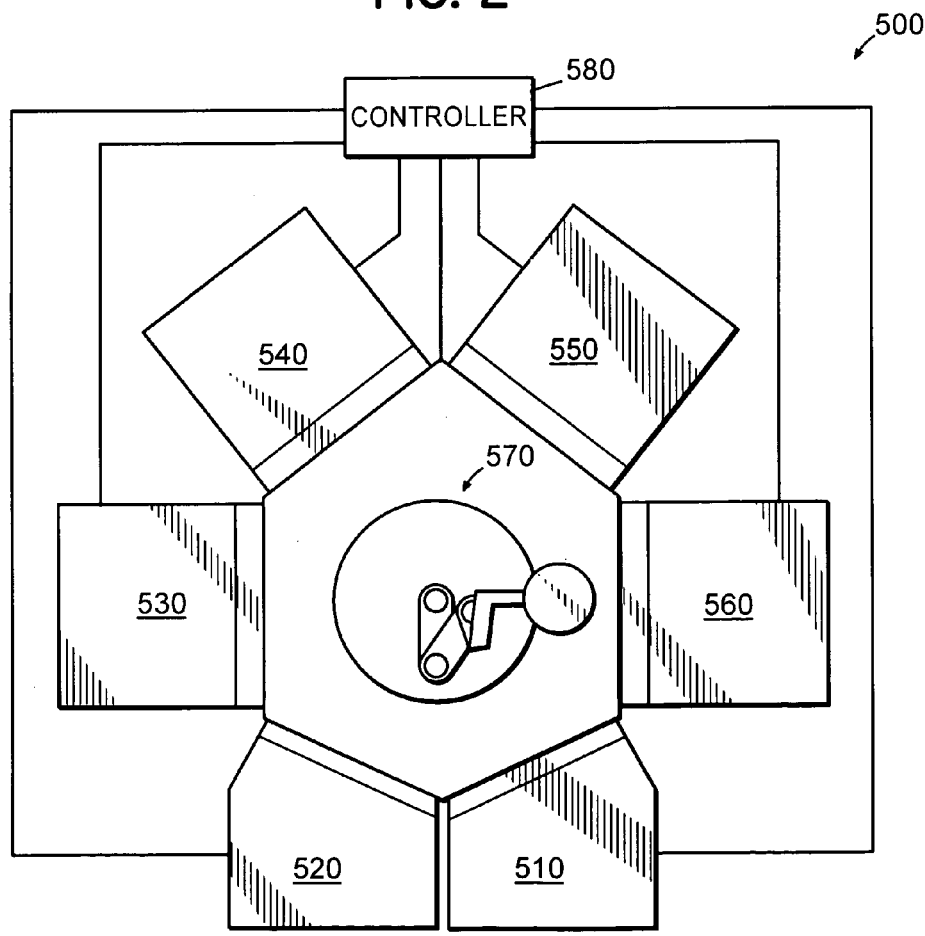
FIG. 5 shows a simplified block diagram of a processing tool for forming a semiconductor device according to an embodiment of the invention.

FIG. 5 shows a simplified block diagram of a processing tool for forming a semiconductor device according to an embodiment of the invention. The processing tool 500 contains substrate loading chambers 510 and 520, processing systems 530-560, robotic transfer system 570, and controller 580. In one embodiment of the invention, formation of a SiGe surface layer, deposition of a high-k dielectric layer, performing an annealing process, and depositing an electrode layer, can be carried out in a single processing system selected from systems 530-560. Alternately, these processes can be carried out in different processing systems. In one embodiment of the invention, formation of a SiGe surface layer can be carried out in processing system 540, deposition of a high-k dielectric layer and an annealing process can be carried out in processing system 550, and formation of an electrode layer can be carried out in processing system 560. In one embodiment of the invention, processing system 530 can be a plasma etch system for defining features in the semiconductor device. The use of multiple process chambers to form the semiconductor device be advantageous to reduce cross-contamination of different layers in the semiconductor device.

In another embodiment of the invention, the processing system 530 can be used as an analysis chamber for determining minimum dimensions of a semiconductor device. The process chamber 530 can, for example, be an Optical Digital Profilometer (ODP™) from TIMBRE Technologies, Santa Clara, Calif.

The processing tool 500 can be controlled by a controller 580. The controller 580 can be coupled to and exchange information with substrate loading chambers 510 and 520, process chambers 530-560, and robotic transfer system 570. For example, a program stored in the memory of the controller 580 can be utilized to control the aforementioned components of the processing tool 500 according to a desired process, and to perform any functions associated with monitoring the process. One example of controller 570 is a DELL PRECISION WORKSTATION 610™, available from Dell Corporation, Dallas, Tex.

In one embodiment of the invention, at least one of the processing systems 530-560 can include a batch-type processing system or a single wafer processing system. In another embodiment of the invention, at least one of the processing systems 530-560 can include a thermal processing system, a plasma processing system, or an atomic layer deposition system.

Although only certain embodiments of this invention have been described in detail above, those skilled in the art will readily appreciate that many modifications are possible in the exemplary embodiment without materially departing from the novel teachings and advantages of this invention. Accordingly, all such modifications are intended to be included within the scope of this invention.

What is claimed is:

1. A method of forming a semiconductor device, the method comprising:
   providing a Si substrate;
   forming a SiGe surface layer having an average Ge content less than about 10 at. % on the Si substrate, wherein the SiGe surface layer has a base portion in contact with the Si substrate and a surface portion;
   depositing a high-k dielectric layer onto the surface portion of the SiGe surface layer;
   forming an oxide layer between the high-k dielectric layer and the base portion of the SiGe surface layer by oxidizing the surface portion of the SiGe surface layer, the oxide layer being formed during one or both of said depositing and an annealing process after said depositing, wherein oxidizing the surface portion of the SiGe surface layer substantially prevents oxidation of the Si substrate during the depositing of the high-k dielectric layer or the annealing process, and wherein the base portion remains unreacted by the oxidizing; and
   forming an electrode layer on the high-k dielectric layer.

2. The method according to claim 1, wherein the Si substrate is provided with an initial oxide layer prior to forming the SiGe surface layer.

3. The method according to claim 1, wherein forming the SiGe surface layer comprises performing thermal chemical vapor deposition, plasma-enhanced chemical vapor deposition, atomic layer deposition, or sputtering.

4. The method according to claim 1, wherein the SiGe surface layer comprises a plurality of SiGe sublayers each with different Ge content.

5. The method according to claim 1, wherein the SiGe surface layer comprises a graded Ge content.

6. The method according to claim 1, wherein the SiGe surface layer is less than about 1000 angstroms thick.

7. The method according to claim 1, wherein the SiGe surface layer is between about 10 angstroms and about 300 angstroms thick.

8. The method according to claim 1, wherein the high-k dielectric layer comprises at least one of $HfO_2$, $HfSiO_x$, $ZrO_2$, $ZrSiO_x$, $TiO_2$, $Ta_2O_5$, $Al_2O_3$, or SiN.

9. The method according to claim 1, wherein the high-k dielectric layer is between about 5 angstroms and about 60 angstroms thick.

10. The method according to claim 1, wherein the providing comprises introducing the Si substrate into a process chamber of one of a single wafer processing system and a process chamber of a batch-type processing system.

11. The method according to claim 1, further comprising etching the electrode layer and the high-k dielectric layer.

12. The method according to claim 1, wherein the oxide layer is formed during the annealing process by exposing the SiGe surface layer to an oxygen-containing gas.

13. The method according to claim 1, wherein forming the SiGe surface layer comprises exposing the Si substrate to a process gas including a Ge-containing gas.

14. The method according to claim 13, wherein the Ge-containing gas comprises at least one of $GeH_4$ or $GeCl_4$.

15. The method according to claim 13, further comprising annealing the Si substrate either during said exposing, after said exposing, or both during and after said exposing.

16. The method according to claim 13, wherein the process gas further comprises a Si-containing gas.

17. The method according to claim 16, wherein the Si-containing gas comprises at least one of $SiH_4$, $Si_2H_6$, or $SiH_2Cl_2$.

18. A method of forming a semiconductor device, the method comprising:
  providing a Si_substrate;
  forming a SiGe surface layer having an average Ge content less than about 10 at. % on the Si substrate, wherein the SiGe surface layer has base portion in contact with the Si substrate and a surface portion;
  depositing a high-k dielectric layer onto the surface portion of the SiGe surface layer;
  annealing the Si substrate having the SiGe surface layer and high-k dielectric thereon; and
  forming an electrode layer on the high-k dielectric layer,
  wherein at least one of the depositing and the annealing comprises oxidizing the surface portion of the SiGe surface layer by exposing the SiGe surface layer to an oxygen-containing gas to form an oxide layer between the high-k dielectric layer and the base portion of the SiGe surface layer, wherein oxidizing the surface portion of the SiGe surface layer substantially prevents oxidation of the Si substrate during the depositing or the annealing, and wherein the base portion remains unreacted by the oxidizing.

19. A method of forming a semiconductor device, the method comprising: providing a single crystal silicon or polycrystalline silicon substrate; forming a SiGe surface layer having an average Ge content less than about 10 at. % on the silicon substrate, wherein the SiGe surface layer has an unreacted portion in contact with the silicon substrate and a surface portion; depositing an oxygen-containing high-k dielectric layer onto the surface portion of the SiGe surface layer;
  forming an oxide layer between the oxygen-containing high-k dielectric layer and the unreacted portion of the SiGe surface layer by oxidizing the surface portion of the SiGe surface layer by diffusing oxygen from the oxygen-containing high-k dielectric layer into the surface portion or by exposing the surface portion to an oxidizing gas under oxidizing conditions or by both the diffusing and the exposing, the oxide layer being formed during one or both of said depositing and an annealing process after said depositing, and wherein oxidizing the surface portion of the SiGe surface layer substantially prevents oxidation of the silicon substrate during the depositing or the annealing process or during both the depositing and annealing; and
  forming an electrode layer on the high-k dielectric layer.

20. The method of claim 19, wherein oxidizing the surface portion of the SiGe surface layer includes exposing the surface portion to the oxidizing gas under oxidizing conditions.

21. The method of claim 19, wherein oxidizing the surface portion of the SiGe surface layer includes diffusing oxygen from the oxygen-containing high-k dielectric layer into the surface portion.

* * * * *